United States Patent [19]
Naimer

[11] 4,368,394
[45] Jan. 11, 1983

[54] COMPUTER-CONTROLLED SWITCHING DEVICE

[76] Inventor: Hubert L. Naimer, Schumanng.33-37, Vienna A-1181, Austria

[21] Appl. No.: 269,060
[22] PCT Filed: Sep. 26, 1980
[86] PCT No.: PCT/AT80/00030
§ 371 Date: May 14, 1981
§ 102(e) Date: May 14, 1981
[87] PCT Pub. No.: WO81/01092
PCT Pub. Date: Apr. 16, 1981

[30] Foreign Application Priority Data
Oct. 2, 1979 [AT] Austria .................. 6438/79

[51] Int. Cl.³ .......................................... H01H 19/14
[52] U.S. Cl. .................................................. 307/115
[58] Field of Search ........................................ 307/115

[56] References Cited
U.S. PATENT DOCUMENTS
4,056,733  11/1977  Prestridge ................ 307/115

FOREIGN PATENT DOCUMENTS
2310103 10/1974 Fed. Rep. of Germany .
2359452  6/1975 Fed. Rep. of Germany .
2736546  2/1979 Fed. Rep. of Germany .

*Primary Examiner*—Donald A. Griffin
*Attorney, Agent, or Firm*—Kurt Kelman

[57] ABSTRACT

A computer-controlled switching device allows the control of such devices as contactors-breakers, protection switches of motors and the like. The computer is connected through an analog-digital converter to at least one current consumption monitoring detector and gives switching orders. The switching device is comprised of a unit module incorporating the detector(s) reacting to the magnetic field generated by the conductor(s) supplying the device to be controlled, the analog-digital converter(s), the computer comprised of a microprocessor, adjusting elements connected to the computer for introducing comparison values and other characteristic values, a cut-off element controlled by the output of the computer, with the relative connection terminals and, optionally, a power-supply unit. The module and its housing have passages for leads to the device to be monitored and detectors are mounted in their proximity.

9 Claims, 5 Drawing Figures

COMPUTER-CONTROLLED SWITCHING DEVICE

The invention relates to a computer-controlling switching device for controlling power switching elements, such as relays, motor protection switches or the like, for controlling devices or installations wherein the computer is connected through an analog-digital converter to at least one detector monitoring the current consumption of the device being monitored, for example a motor, transformer or the like, and emits switching signals when predetermined values are exceeded and/or are not reached.

Such a switching arrangement for switching devices of this type are known from DE-AS (accepted German patent application) No. 2,310,103.

Furthermore, it has been proposed in DE-OS (laid-open German patent application) No. 2,641,677 to arrange all elements, that is power and control part, of a three-phase drive for smaller to average power and voltages on a printed circuit board.

It is the object of the invention to provide a switching device of the first-mentioned kind, which is easy to mount and which is distinguished by a very simple mechanical structure.

This is achieved according to the invention by combining in a known manner the detector(s) responsive to the magnetic field of the conductor(s) leading to the device to be monitored, the analog-digital converter(s), the computer comprised of a microprocessor, the adjusting elements connected thereto for the input of comparison values and additional characteristic data, as well as a switching element controlled by the output of the computer, together with the associated terminals and optionally a power-supply unit or a voltage source into a unit module, and this unit module as well as the housing thereof defines passages for the conductors leading to the device or the like to be monitored and the detectors constituted, for example, by Hall generators are arranged in their proximity. The compact structure of the switching device and the arrangement of passages for the conductors leading to the device to be monitored make a very simple assembly of the device possible. In practice, it is only necessary to disconnect the conductors from the device to be protected or controlled or from the power switching element and to lead them through the switching device and re-connect them, the same as the control conductors leading to the power switching element.

In the case of the use of Hall generators as detectors in combination with the computer, the control device has the advantage that it is usable in a broad band width in relation to the magnitude of the currents to be monitored. Such a combination may readily attain, for example, a current adjustment range of 1:10 in protection switches for motors.

A particularly simple mechanical structure of the switching device according to the invention results from a unit module consisting essentially of two prints electrically interconnected by detachable plug connections, one of which is equipped with the switching element controlled by the computer as well as optionally a power-supply unit and/or a voltage source and the other one is equipped with the detector and the computer, together with the analog-digital converters and the adjusting elements. This substantially facilitates the design of the prints and, at the same time, the electronic structural parts operating with the lower voltages are separated from the structural parts usually operating with higher voltages, such as a power-supply unit or the switching element controlled by the computer, the latter, of course, only with respect to its output circuit. The arrangement of the electronic structural parts operating only with lower voltages, for instance 5 V, and those operating with a higher voltage, for instance 220 V, such as power-supply unit and switching element, on separate prints avoids sources of trouble.

With respect to the manufacture and as low a cost as possible in the assembly of the switching device, it is particularly advantageous if a housing is provided for the mechanical connection of the two prints, which is comprised of two halves which have passages or recesses for receiving the terminals and the adjusting elements as well as passages corresponding to the leads, and which may be interconnected—preferably by a snap connection—and which have bosses on their interior surfaces which, in the assembled condition of the housing, press on the printed circuit boards with their facing surfaces, the two prints being preferably interconnected with their facing conductive sides.

The invention will now be explained in more detail in conjunction with the drawings wherein FIGS. 1 and 2 show different embodiments of a switching device according to the invention;

Figure 1:
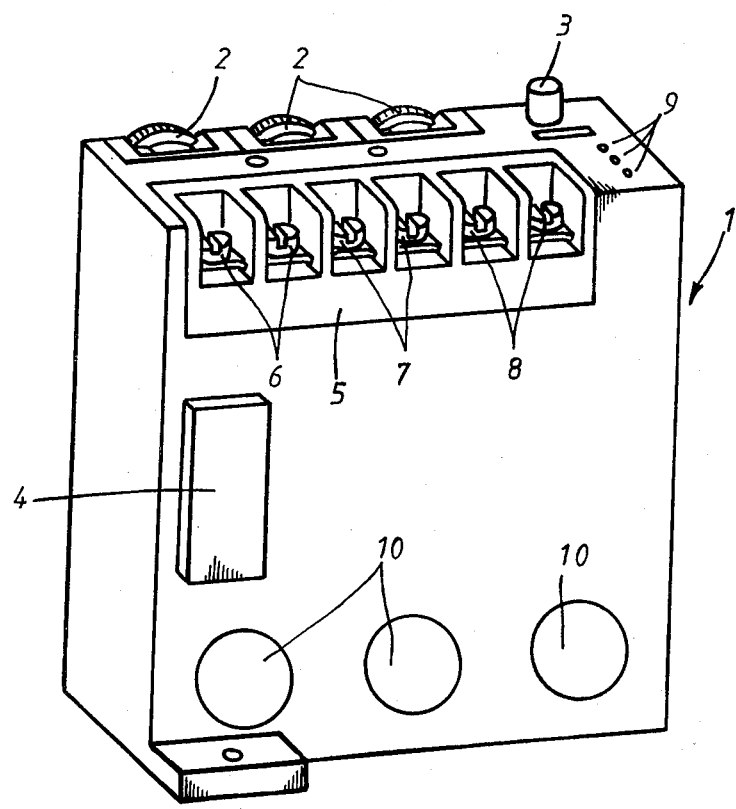

Switching device 1, 1' is a unit module equipped with adjusting elements 2 for the setting or input of characteristic data, for example the nominal current of the motor to be monitored, in the computer as well as additional, non-illustrated adjusting elements for setting additional characteristic data, for example concerning starting conditions, ambient temperature or the like. Further, reset button 3 is provided for resetting switching element 4 when the same responds in case of malfunction. Terminal block 5 carries terminals 6 for the connection of the coil of the power switching element to be controlled, terminals 7 for a malfunction indicator and terminals 8 for the remote control of the resetting of switching element 4. In addition, light diodes 9 are provided for indicating malfunctions. Passages 10 are provided for the conductors leading to the device to be monitored.

Figure 2:
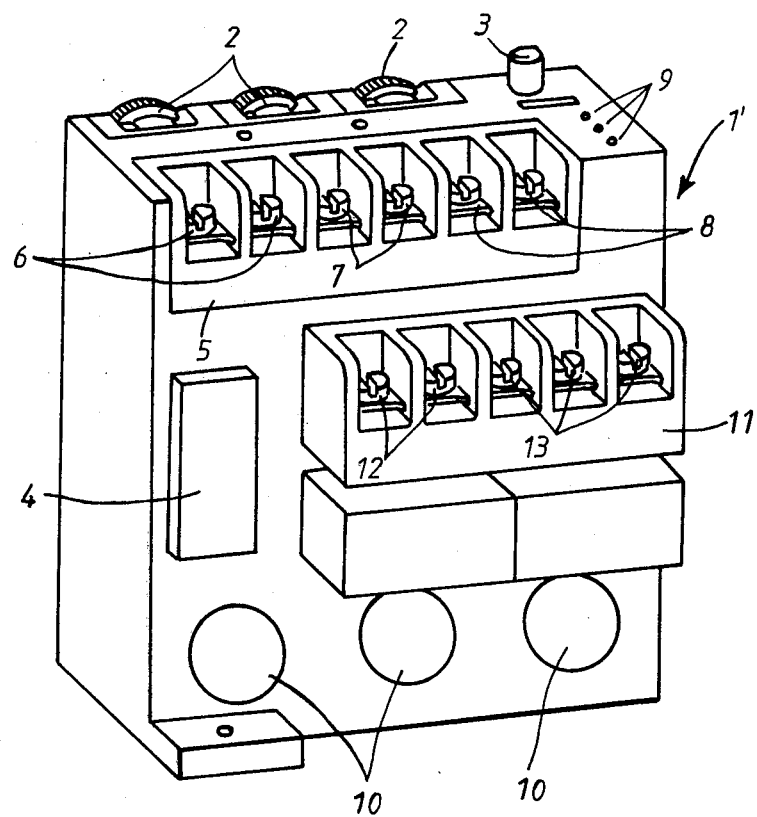
Figure 3:
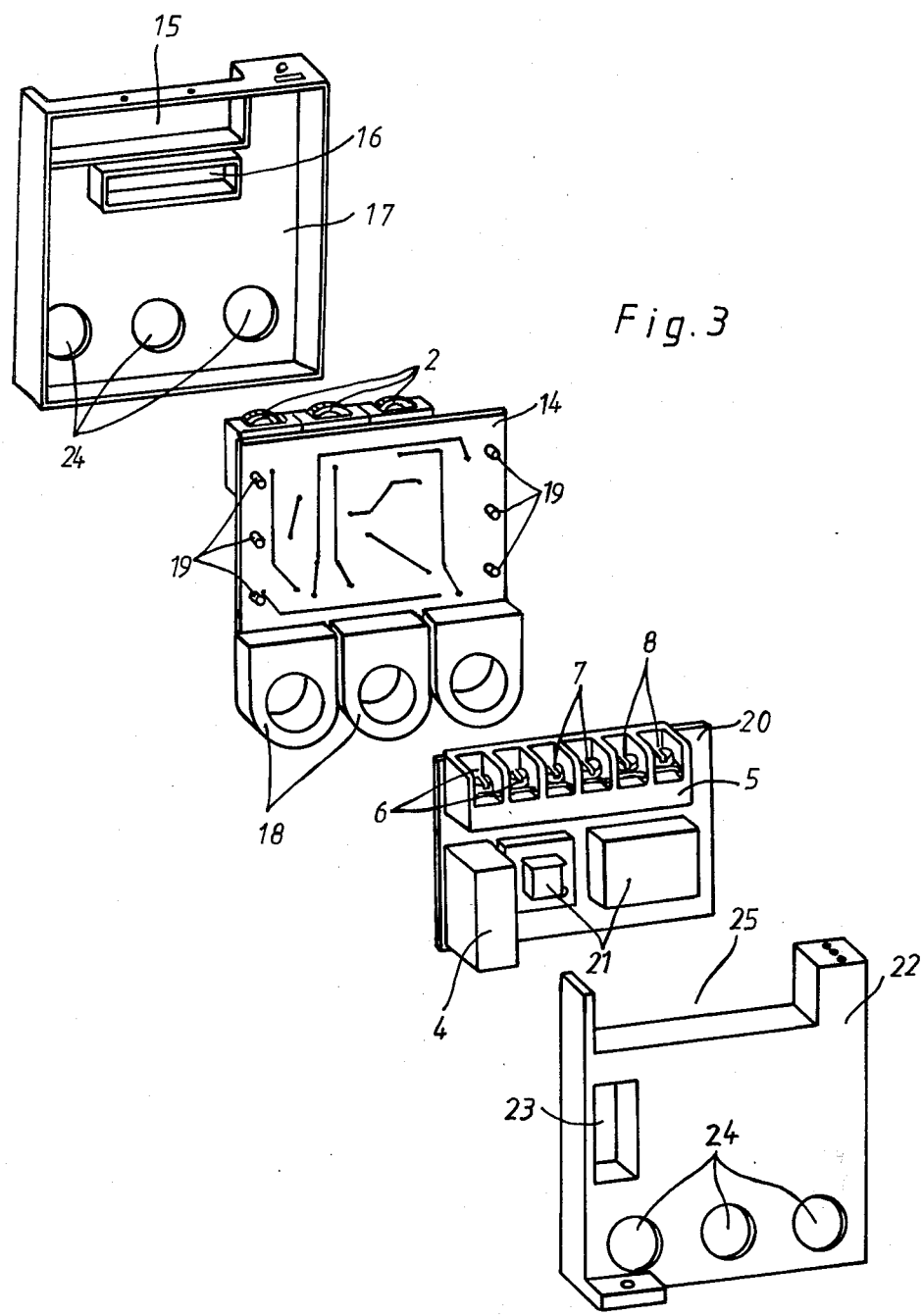
FIG. 3 is an exploded view of the switching device of FIG. 1.

The embodiment of FIG. 2, which is provided additionally for the control of star delta relays, also has another terminal block 11 with terminals 12 for the connection of a thermodetector of the motor and terminals 13 for the connection of the coils of the star delta relay. The structure of switching device 1 is shown in FIG. 3.

Adjusting elements 2, as well as additional, non-illustrated adjusting elements, are arranged in recesses 15 and 16 in housing half 17. Furthermore, printed circuit board 14 carries detectors 18 responsive to the magnetic field generated by the conductors leading to the device to be protected, which may be comprised, for example of Hall generators cast into synthetic resin blocks defining passages for the conductors or of toroidal core converters, and the non-illustrated computer comprised of a microprocessor, together with the associated analog-digital converters and the reset switch for resetting switching element 4 as well as light diodes 9, together with the control circuit therefor for indicating a malfunction. Furthermore, brushings 19 are arranged on print 14 for providing an electrical connection between prints 14 and 20.

Printed circuit 20 is equipped essentially with terminal block 5, switching element 4 and power-supply unit 21 as well as pins fitting into bushings 19 at the rear side thereof to provide an electrical connection between the two printed circuits. Print 20 corresponds in its dimensions to the section of print 14 free of detectors 18. The two printed circuits are mechanically held together, in addition to the friction fit of the pins in bushings 19, by the two halves 17 and 22 of the housing which have passages 15, 16, 23, 24 and recess 25 and which may be assembled by a non-illustrated snap connection. Passages 15, 16, 23 and recesses 24 are delimited by walls or shoulders which are inwardly directed and whose facing end surfaces define a gap wherebetween the two prints 14, 20 are clamped when the two housing halves 17, 22 are interconnected.

Figure 4:
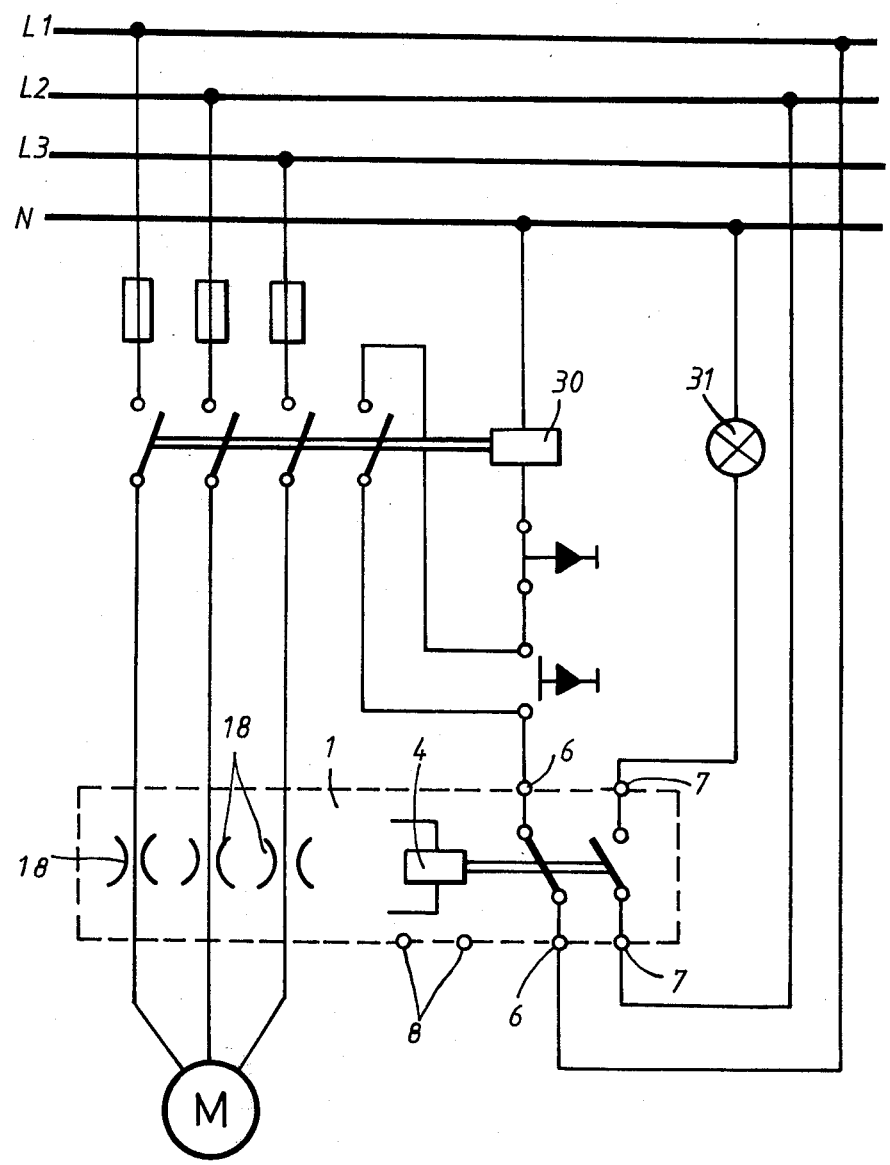
FIGS. 4 and 5 are circuit diagrams for the operation of the switching devices according to FIGS. 1 and 2.

FIG. 4 shows a circuit diagram for the operation of a switching device according to the invention, switching device 1 controlling relay 30 for actuating motor M and signal lamp 31.

Figure 5:
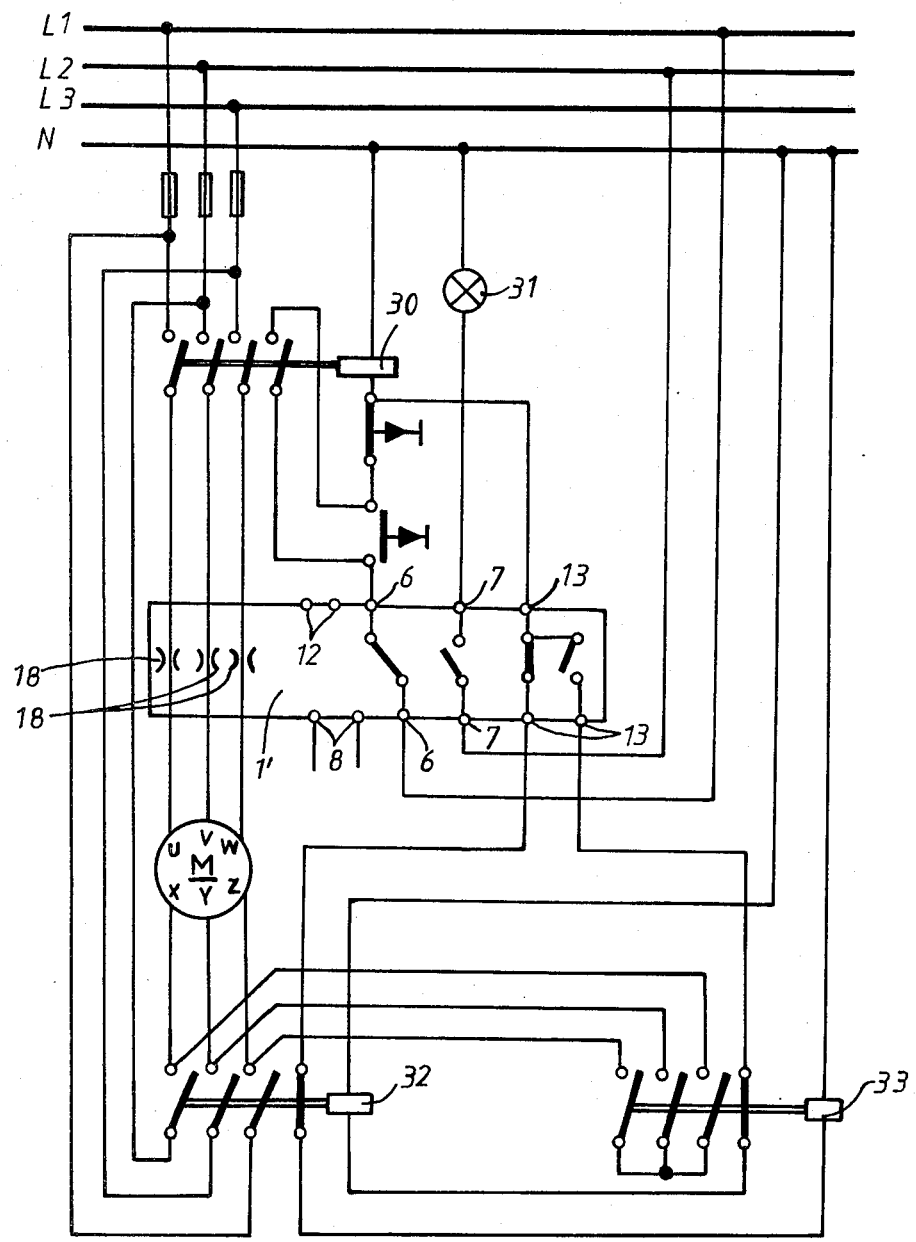

According to the circuit diagram of FIG. 5, switching device 1' is also capable of controlling star delta relays 32, 33, the star relay being cut off when the nominal current of the motor falls below a predetermined value, for example 90%, while the delta relay is switched on only after the electric switching arcs of the star relay have been extinguished and immediately after the motor currents have reached a zero value, the value of the current being determined by the computer on the basis of the data input and the determined operating parameters, such as, for example, duration, intensity as well as idle time before the start to be monitored.

Switching 1, 1' may usefully be supplied with current through conductors L1 and L2 connected to terminals 6 and 7, which make it possible to supply energy to the computer while M is idle and maintains switching element 4 which may be comprised of a semi-conductor structural part. Furthermore, however, a battery may be provided for supplying current to switching device 1, 1' so that the determination of the operating parameters is not interrupted in case of a power failure. This battery may be charged constantly through the power-supply unit.

I claim:

1. Computer-controlled switching device for controlling power switching elements for controlling devices wherein the computer is connected through an analog-digital converter to at least one detector monitoring the current consumption of the device being monitored, and emits switching signals when predetermined values are exceeded and/or are not reached, characterized in that the detector responsive to the magnetic field of the conductor leading to the device to be monitored, the analog-digital converter, the computer comprised of a microprocessor, adjusting elements connected thereto for the input of comparison values and additional characteristic data, a switching element controlled by the output of the computer, and associated terminals are combined into a unit module, this unit module as well as a housing therefor defines passages for the conductors leading to the device to be monitored, and the detector is arranged in their proximity.

2. Switching device according to claim 1, characterized in that the unit module is comprised essentially of two printed circuits which are electrically connected by detachable plug connections and one of which is equipped with the terminals and the switching element controlled by the computer, and the other one is equipped with said detectors (18) and the computer, together with the analog-digital converter and the adjusting elements.

3. Switching device according to claim 1, further comprising a power-supply unit combined into the unit model.

4. Switching device according to claim 1, wherein the said detector is constituted by a Hall generator.

5. Computer-controlled switching device for controlling power switching elements controlling devices wherein the computer is connected through an analog-digital converter to at least one detector monitoring the current consumption of the device being monitored, and emits switching signals when predetermined values are exceeded and/or are not reached, characterized in that the detector responsive to the magnetic field of the conductors leading to the device to be monitored, the analog-digital converter, the computer comprised of a microprocessor, adjusting elements connected thereto for the input of comparison values and additional characteristic data, a switching element controlled by the output of the computer, and associated terminals are combined into a unit module, the unit module is comprised essentially of two printed circuits electrically connected by detachable plug connections, one of the printed circuits is equipped with the terminals and the switching element controlled by the output of the computer and the other printed circuit is equipped with said detector and the computer, together with the analog-digital converter and the adjusting elements, said unit module and a housing therefor defines passages for the conductors leading to the device to be monitored, and the said detector is arranged in their proximity, the housing being comprised of two halves and arranged for mechanically connecting the two printed circuits, the housing having passages for receiving the terminals and the adjusting elements as well as passages corresponding to passages in the printed circuits, and the housing halves are connectable and have bosses at the inner surfaces thereof, the bosses pressing on the printed circuits with their facing surfaces in the assembled condition of the housing.

6. Switching device according to claim 5, characterized in that the two printed circuits are interconnected with their facing conductive sides.

7. Switching device according to claim 5, wherein the one printing circuit is also equipped with a power-supply unit.

8. Switching device according to claim 5, characterized in that the said detector is constituted by a Hall generator.

9. Switching device according to claim 5, further comprising a snap connection for connecting the housing halves.

* * * * *